(12) United States Patent
Eom et al.

(10) Patent No.: US 8,604,606 B2
(45) Date of Patent: Dec. 10, 2013

(54) HEAT SINK PACKAGE

(75) Inventors: Joo-yang Eom, Bucheon-si (KR); O-seob Jeon, Woojangsan Hyundai Town (KR); Seung-won Lim, Bucheon-si (KR); Seung-yong Choi, Seoul (KR)

(73) Assignee: Fairchild Korea Semiconductor, Ltd., Bucheon-si (KR)

( * ) Notice: Subject to any disclaimer, the term of this patent is extended or adjusted under 35 U.S.C. 154(b) by 23 days.

(21) Appl. No.: 12/845,299

(22) Filed: Jul. 28, 2010

(65) Prior Publication Data
US 2010/0289137 A1 Nov. 18, 2010

Related U.S. Application Data

(62) Division of application No. 12/358,758, filed on Jan. 23, 2009, now Pat. No. 7,786,570.

(30) Foreign Application Priority Data

Feb. 4, 2008 (KR) .................. 10-2008-0011058

(51) Int. Cl.
*H01L 23/10* (2006.01)
*H01L 23/34* (2006.01)

(52) U.S. Cl.
USPC ............ 257/706; 257/707; 257/712; 257/717

(58) Field of Classification Search
USPC ........................................ 257/706, 707, 717
See application file for complete search history.

(56) References Cited

U.S. PATENT DOCUMENTS 5,396,403 A 3/1995 Patel
2004/0046241 A1* 3/2004 Combs et al. ................ 257/678
2007/0126116 A1 6/2007 Dangelo et al.

FOREIGN PATENT DOCUMENTS

KR 1020080079927 A 9/2008

* cited by examiner

*Primary Examiner* — Thien F Tran
(74) *Attorney, Agent, or Firm* — Christensen O'Connor Johnson Kindness PLLC

(57) ABSTRACT

Provided are a heat sink package in which a semiconductor package and a heat sink are bound to each other and a method of fabricating the same. The heat sink package includes a heat sink having a cavity on an upper surface thereof; a metal layer formed on the bottom surface of the cavity; a solder paste layer formed on the metal layer; a substrate on the solder paste layer; and a lead and a semiconductor chip mounted on the substrate.

16 Claims, 20 Drawing Sheets

HEAT SINK PACKAGE

CROSS-REFERENCE TO RELATED PATENT APPLICATION

This application is a divisional of U.S. patent application Ser. No. 12/358,758 filed Jan. 23, 2009 which claims the benefit of Korean Patent Application No. 10-2008-0011058, filed on Feb. 4, 2008, in the Korean Intellectual Property Office, the disclosures of which are incorporated herein in their entirety by reference.

BACKGROUND OF THE INVENTION

1. Field of the Invention

The present invention relates to a heat sink package in which a semiconductor package and a heat sink are bound to each other and a method of fabricating the same.

2. Description of the Related Art

Generally, a semiconductor package is prepared by mounting a single or a plurality of semiconductor chips on a chip pad in a lead frame, and sealing the chips using a molding member such as epoxy molding compound (EMC) to protect the inside of the semiconductor package, and the semiconductor package is mounted on a printed circuit board (PCB) substrate. Recently, as electronic devices have increasingly been made with high speed, large capacity and high integration, there is a need to achieve small sized, inexpensive and light weight power devices applied to automobiles, industrial machinery and home appliances.

Power devices such as a silicon-controlled rectifier (SCR), a power transistor, an insulated-gate bipolar transistor (IGBT), a metal oxide semiconductor (MOS) transistor, a power rectifier, a power regulator, an inverter, a converter, and a combination thereof are designed to operate at a voltage in the range of 30 to 1000 V or greater. Such power devices are distinguished from conventional logic or memory devices that operate at a high voltage, and thus a semiconductor package for power devices needs to have superior heat discharging capability for discharging heat generated from the power devices and insulating properties for operating at a high voltage.

Generally, in order to discharge heat generated from power devices, a heat sink is assembled on a semiconductor package as disclosed by Fairchild Semiconductor Corporation in Korean Patent Application No. 2007-20564.

FIG. 1 is an exploded perspective view of a conventional semiconductor package for power devices 10 and a heat sink 30.

Referring to FIG. 1, a heat sink 30 formed of a metallic material may be attached to a semiconductor package for power devices 10. The heat sink 30 is assembled to a semiconductor package for power devices 10 by a bolting member 20 that passes through a bolting hole 10h of the semiconductor package for power devices 10.

Typically, a resin-based material used for a transfer molding process, such as an epoxy molding compound (EMC) is used as a molding member 10a forming the external shape of a semiconductor package for power devices. Since the semiconductor package for power devices 10 can be simply and economically fabricated using such a resin-based material, the resin-based material is applied to various fields. However, when the heat sink 30 and the semiconductor package for power devices 10 are assembled by the bolting member 20, cracks and warpages may be induced in the molding member 10a due to compressive stress and shear stress applied to the surface of the semiconductor package for power devices 10 by the bolts.

Such cracks and warpages may provide a moisture absorbing passage in the semiconductor package for power devices 10 or destroy insulation so that reliability or lifetime of the power devices may be decreased.

In addition, an insulation sheet and/or a thermal grease is generally interposed between the semiconductor package for power devices 10 and the heat sink 30. However, the insulation sheet and/or the thermal grease may increase thermal resistance so that reliability or lifetime of the power devices may be decreased.

SUMMARY OF THE INVENTION

The present invention provides a heat sink package in which a semiconductor package and a heat sink are bound to each other in order to prevent cracks and warpages and secure low thermal resistance.

According to an aspect of the present invention, there is provided a heat sink package. The heat sink package includes: a heat sink having a cavity on an upper surface thereof; a metal layer formed on the bottom surface of the cavity; a solder paste layer formed on the metal layer; a substrate on the solder paste layer; and a lead and a semiconductor chip mounted on the substrate. The heat sink may comprise aluminum and the metal layer may comprise copper. The substrate may be a direct bonded copper (DBC) substrate, a thick or thin film copper (TFC) substrate or a direct fired copper (DFC) substrate. The metal layer, the solder paste layer, the substrate and the semiconductor chip may be arranged in the cavity. The depth H of the cavity may be greater than the sum of a height of the metal layer, a height of the solder paste layer, a height of the substrate and a height of the semiconductor chip. The heat sink package may further comprise an epoxy resin filling in the cavity in order to protect the metal layer, the solder paste layer, the substrate and the semiconductor chip. The lead may extend from the substrate outside of the epoxy resin.

According to another aspect of the present invention, there is provided another heat sink package. The heat sink package includes: a heat sink having a cavity on an upper surface thereof; a metal layer formed on the bottom surface of the cavity; a solder paste layer formed on the metal layer; and a semiconductor package on the solder paste layer. The heat sink may comprise aluminum and the metal layer comprises copper. The semiconductor package may comprise: a substrate; a lead and a semiconductor chip on the substrate; and a molding member sealing the semiconductor chip on the substrate. The substrate may be selected from the group consisting of a direct bonded copper (DBC) substrate, a thick or thin film copper (TFC) substrate and a direct fired copper (DFC) substrate.

According to another aspect of the present invention, there is provided another heat sink package. The heat sink package includes: a heat sink; a metal layer formed on the heat sink; a solder paste layer formed on the metal layer; and a semiconductor package on the solder paste layer. A groove may be formed on the upper surface of the heat sink around the solder paste layer in order to prevent overflow of the solder paste layer. The semiconductor package may comprise: a substrate; a lead and a semiconductor chip on the substrate; and a molding member sealing the semiconductor chip on the substrate. The lead may extend from the substrate outside of the molding member. The substrate may be selected from the group consisting of a direct bonded copper (DBC) substrate, a thick or thin film copper (TFC) substrate and a direct fired copper (DFC) substrate.

According to another aspect of the present invention, there is provided another heat sink package. The heat sink package includes: a heat sink having a cavity on an upper surface thereof; an insulating anodized layer formed on the bottom surface of the cavity; a metal layer pattern on the anodized layer; and a lead and a semiconductor chip mounted on the metal layer. The heat sink may comprise aluminum and the anodized layer comprises $Al_2O_3$. The anodized layer, the metal layer pattern and the semiconductor chip may be arranged in the cavity. The depth H of the cavity may be greater than the sum of a height of the anodized layer, a height of the metal layer pattern, and a height of the semiconductor chip. The heat sink package may further include an epoxy resin filling in the cavity in order to protect the anodized layer, the metal layer pattern and the semiconductor chip. The lead extends from the metal layer pattern outside of the epoxy resin.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
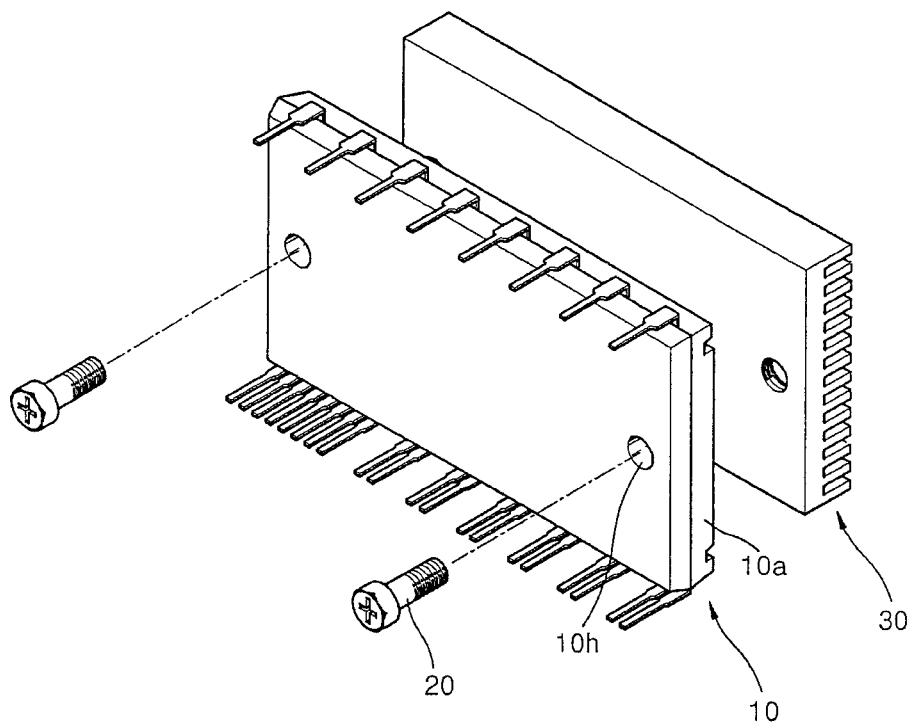
FIG. 1 is an exploded perspective view of a conventional semiconductor package for power devices and a heat sink.

The present invention will now be described more fully with reference to the accompanying drawings, in which exemplary embodiments of the invention are shown. The present invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, thicknesses of layers and regions may be exaggerated for clarity.

Like reference numerals in the drawings denote like elements. It will also be understood that when an element such as a layer, a region or a substrate is referred to as being "on" another element, it can be directly on the other element, or intervening elements may also be present.

Also, spatially relative terms, such as "above" or "upper" and "below" or "lower" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "above" other elements or features would then be oriented "below" the other elements or features. Thus, the exemplary term "above" can encompass both an orientation of above and below.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc., may be used herein to describe various elements, components, regions, layers and/or sections, these elements, components, regions, layers and/or sections should not be limited by these terms. These terms are only used to distinguish one element, component, region, layer or section from another region, layer or section.

Figure 2:
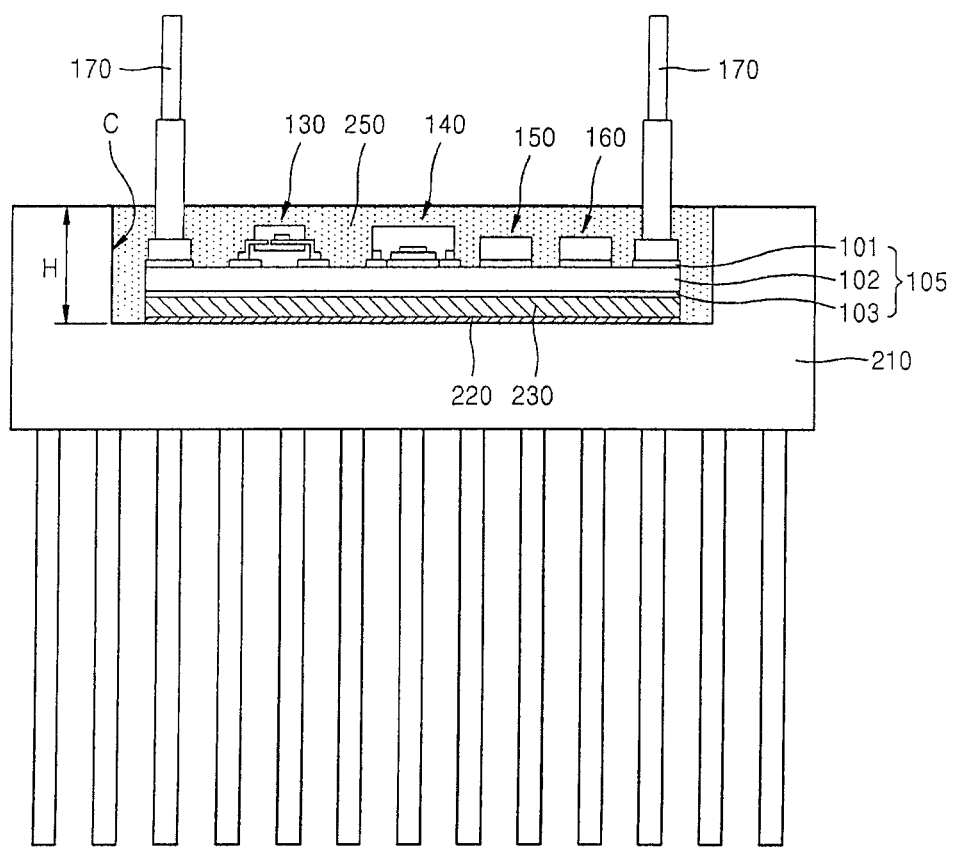
FIG. 2 is a cross-sectional view of a heat sink package according to an embodiment of the present invention.

FIG. 2 is a cross-sectional view of a heat sink package according to an embodiment of the present invention.

Referring to FIG. 2, a heat sink package includes a heat sink 210 having a cavity C on an upper surface thereof. A metal layer 220 is formed on the bottom surface of the cavity C. The metal layer 220 may be formed on the entire or a part of bottom surface of the cavity C.

The heat sink 210 may include aluminum. In this case, the metal layer 220 may include copper. However, these materials forming the heat sink 210 and the metal layer 220 are exemplarily described, and the scope of the present invention is not limited thereto. The copper layer may be formed, for example, by plating, but may also be formed by a chemical vapor deposition.

A solder paste layer 230 is formed on the metal layer 220. Since the solder paste layer 230 assembles the heat sink 210 and the substrate 105, a bolt member which is conventionally required is not necessary.

A substrate 105 is attached to the solder paste layer 230. The substrate may be a direct bonded copper (DBC) substrate, a thick or thin film copper (TFC) substrate or a direct fired copper (DFC) substrate. FIG. 2 illustrates a DBC substrate or TFC substrate. The DBC substrate or TFC substrate may include an insulating layer 102 formed of an insulating material, for example, a ceramic material, an upper pattern 101 formed of copper and a lower pattern 103 formed of copper. The insulating layer 102 included in the substrate 105 insulates semiconductor chips 130, 140, 150 and/or 160 and the heat sink 210.

A lead 170 and at least one of the semiconductor chips 130, 140, 150 and/or 160 are mounted on the substrate 105. The semiconductor chips 130, 140, 150 and/or 160 may include a power control semiconductor chip and/or a low-power semiconductor chip driving the power control semiconductor chip. For example, the semiconductor chips 130, 140, 150 and/or 160 may include a silicon-controlled rectifier (SCR), a power transistor, an insulated-gate bipolar transistor (IGBT), a metal oxide semiconductor (MOS) transistor, a power rectifier, a power regulator, an inverter, a converter, a manual device or a combination thereof. The semiconductor chips 130, 140, 150 and/or 160 are electrically connected to the substrate 105 by a bonding wire (not shown).

Although a dual in-line package (DIP) having two rows of leads 170 is exemplarily illustrated in FIG. 2, the scope of the present invention is not limited to the structure of the lead 170. For example, a single in-line package (SIP) having a single row of the lead 170 may be applied.

The depth H of the cavity C of the heat sink 210 may be greater than the sum of a height of the metal layer 220, a height of the solder paste layer 230, a height of the substrate 105 and a height of the semiconductor chip 130, 140, 150 or 160. Here, the metal layer 220, the solder paste layer 230, the substrate 105 and the semiconductor chips 130, 140, 150 and/or 160 are arranged in the cavity C and do not protrude the upper surface of the heat sink 210.

Empty space of the cavity C may be filled with an epoxy resin 250 in order to protect the metal layer 220, the solder paste layer 230, the substrate 105 and the semiconductor chips 130, 140, 150 and/or 160. The lead 170 may extend from the substrate 105 outside of the epoxy resin 250. Thus, only a part of the lead 170 can be sealed with the epoxy resin 250.

Figure 3A:
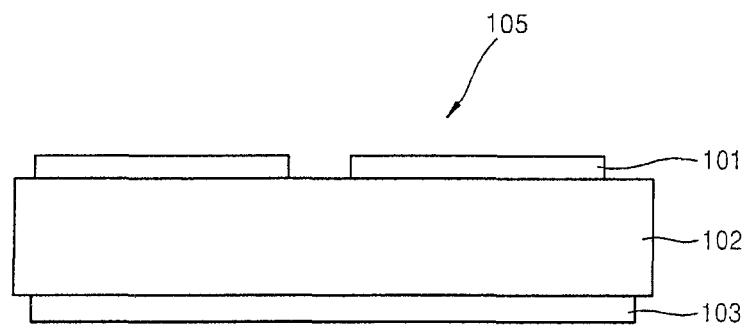
FIGS. 3A to 3E, 3G and 3H are cross-sectional views of the heat sink package of FIG. 2.
Figure 3B:
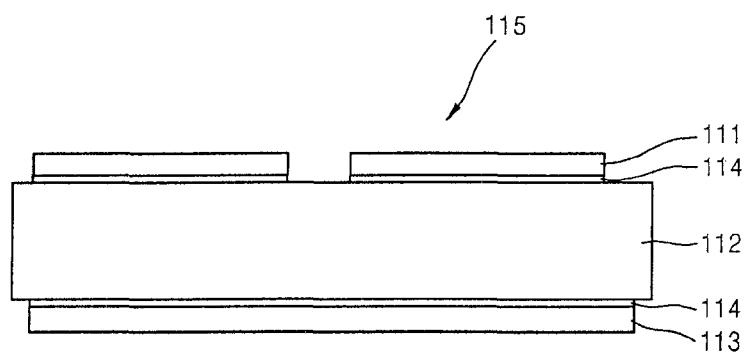
Figure 3C:
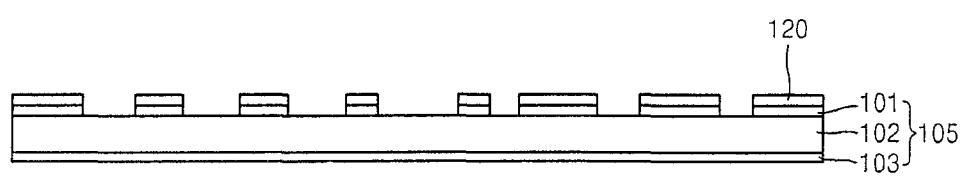
Figure 3D:
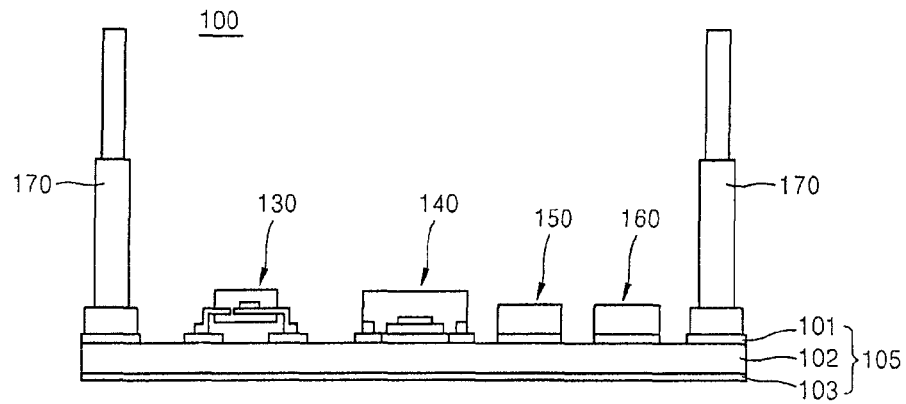
Figure 3E:
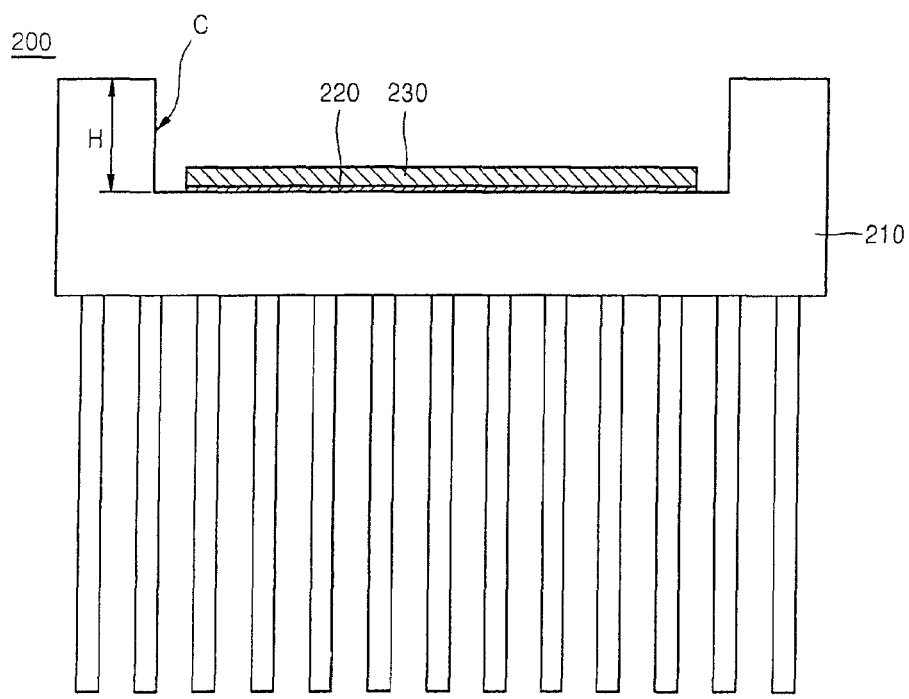
Figure 3F:
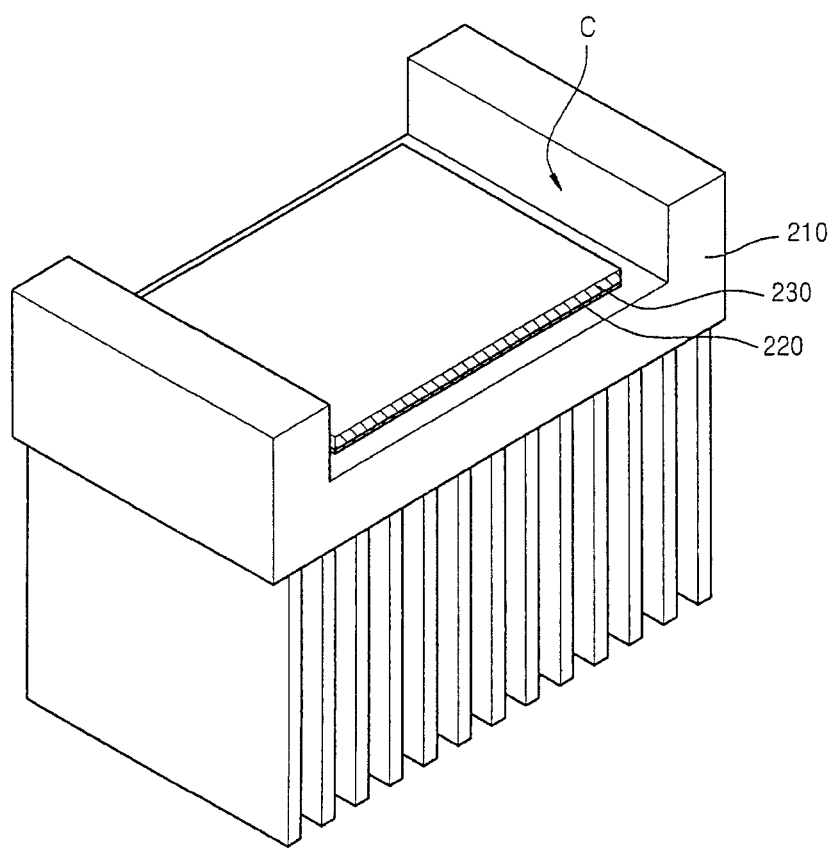
FIG. 3F is a perspective view of the heat sink package of FIG. 2.

FIGS. 3A to 3E, 3G and 3H are cross-sectional views of the heat sink package of FIG. 2, and FIG. 3F is a perspective view of the heat sink package of FIG. 2.

First, referring to FIGS. 3A and 3B, a substrate 105 or 115 is prepared.

FIG. 3A illustrates a direct bonded copper (DBC) substrate or a thick or thin film copper (TFC) substrate. The DBC substrate or TFC substrate 105 includes an insulating layer 102 formed of an insulating material, for example, a ceramic material, an upper pattern 101 formed of copper and a lower pattern 103 formed of copper.

FIG. 3B illustrates a direct fired copper (DFC) substrate. The DFC substrate 115 includes an insulating layer 112 formed of an insulating material, for example, a ceramic material, an upper pattern 111 formed of copper and a lower pattern 113 formed of copper. A bonding layer 114 may be interposed between the insulating layer 112 and the upper pattern 111, and between the insulating layer 112 and the lower pattern 113. The bonding layer 114 may include Ag.

For descriptive convenience, hereinafter the DBC substrate or TFC substrate 105 will be exemplarily described. However, it may be replaced by the DFC substrate 115, and the scope of the present invention is not limited to the type of the substrate.

Referring to FIG. 3C, a first solder paste layer 120 is formed on the DBC substrate or TFC substrate 105. The first solder paste layer 120 may be formed using screen printing.

Referring to FIG. 3D, lead 170 and at least one of the semiconductor chips 130, 140, 150 and/or 160 are mounted on the DBC substrate or TFC substrate 105 through the medium of the first solder paste layer 120 to form a first structure 100. In FIG. 3D, the first solder paste layer, although it is not shown, may be interposed between the upper pattern 101 and the lead 170 and between the upper pattern 101 and at least one of semiconductor chips 130, 140, 150 and/or 160.

Referring to FIGS. 3E and 3F, a heat sink 210 having a cavity C on an upper surface thereof is prepared. A metal layer 220 is formed on the bottom surface of the cavity C. The metal layer 220 may be formed on the entire or a part of bottom surface of the cavity C. The heat sink 210 may include aluminum. In this case, the metal layer 220 may include copper. However, these materials forming the heat sink 210 and the metal layer 220 are exemplarily described, and the scope of the present invention is not limited thereto. The copper layer may be formed, for example, by plating, but may also be formed by a chemical vapor deposition.

A second solder paste layer 230 is formed on the metal layer 220 to form a second structure 200. The second solder paste layer 230 may be formed on the metal layer 220 using dotting or screen printing. Since the second solder paste layer 230 assembles the heat sink 210 and the substrate 105, a bolt member which is conventionally required is not necessary.

Referring to the cross-sectional view of the second structure 200 shown in FIG. 3E and the perspective view of the second structure 200 shown in FIG. 3F, the cavity C has a concave shape on the upper surface of the heat sink 210. However, the cavity is exemplarily illustrated. The cavity C may have any configuration as long as the substrate 105 and the semiconductor chips 130, 140, 150 and/or 160 constituting the first structure 100 can be arranged in the cavity C and do not protrude the upper surface of the heat sink 210. For example, according to FIG. 3F, the cavity C in a length direction of the heat sink 210 are closed by side walls and the cavity in a width direction of the heat sink 210 are open. However, all of the side walls of the cavity C may be closed according to another embodiment.

The depth H of the cavity C of the heat sink 210 may be greater than the sum of a height of the metal layer 220, a height of the second solder paste layer 230, a height of the substrate 105 and a height of the semiconductor chip 130, 140, 150 or 160.

Figure 3G:
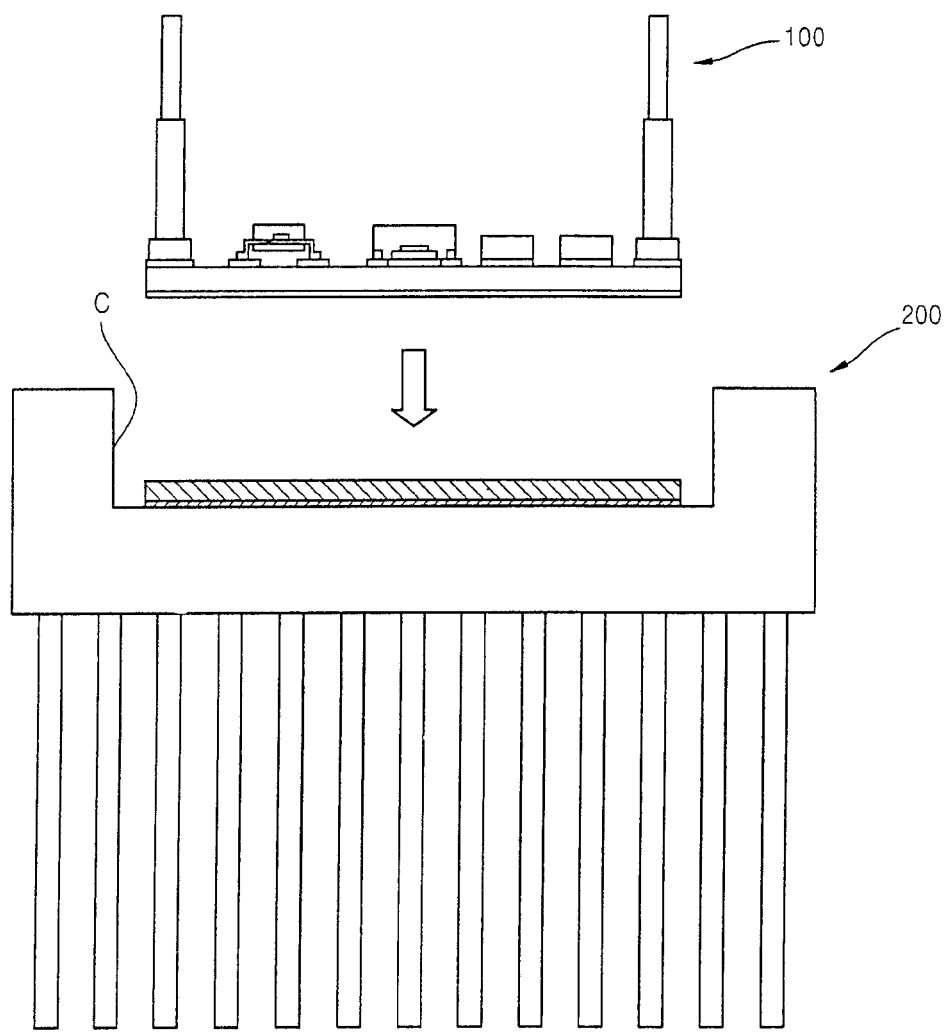

Referring to FIG. 3G, the first structure 100 is mounted on the second structure 200. That is, the substrate is mounted on the heat sink by directly contact and bind the substrate of the first structure 100 and the second solder paste layer of the second structure 200.

Figure 3H:
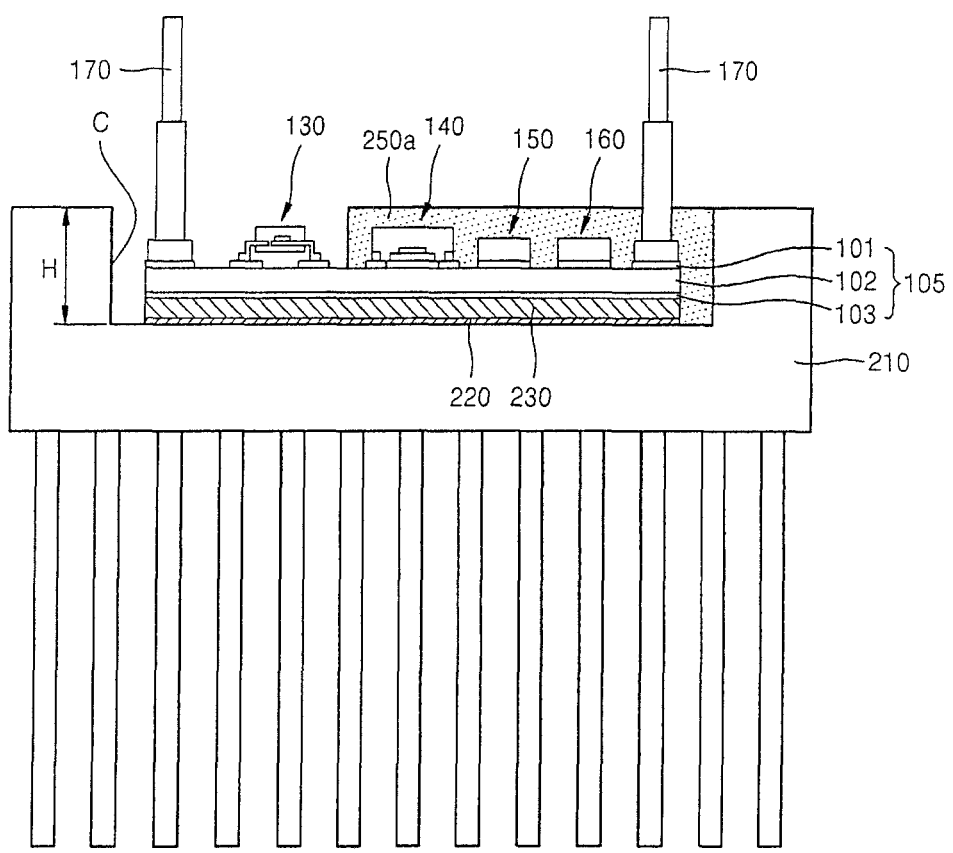

Referring to FIG. 3H, empty space of the cavity C may be filled with an epoxy resin 250a in order to protect the metal layer 220, the solder paste layer 230, the substrate 105 and the semiconductor chips 130, 140, 150 and/or 160. FIG. 3H illustrates a process of filling the cavity C with an epoxy resin 250a. The epoxy resin 250a may be filled in the cavity C using a potting method. After the cavity C is filled with the epoxy resin 250, a curing process is performed. Subsequently, electrical tests are performed to determine the performance of products.

Figure 4:
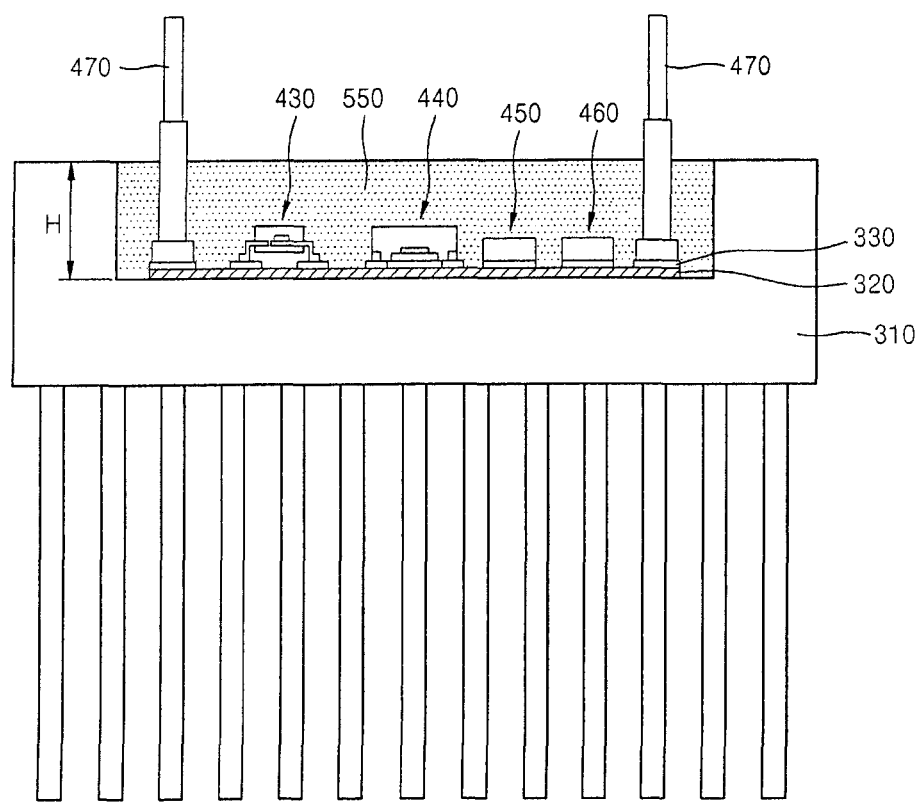
FIG. 4 is a cross-sectional view of a heat sink package according to another embodiment of the present invention.

FIG. 4 is a cross-sectional view of a heat sink package according to another embodiment of the present invention.

Referring to FIG. 4, a heat sink package includes a heat sink 310 having a cavity on an upper surface thereof. An insulating anodized layer 320 is formed on the bottom surface of the cavity C. The anodized layer 320 may be formed on the entire or a part of the bottom surface of the cavity C.

A metal, for example aluminum, is connected to an anode and electrolyzed in a diluted acidic solution. Then, an oxide film, for example, alumina having a strong cohesive force with the metal is formed by oxygen generated in the anode. This is different from electroplating in which a metal is connected to a cathode.

The heat sink 310 may include aluminum. In this case, the anodized layer 320 may include alumina ($Al_2O_3$). However, the present invention is not limited thereto, and metals such as copper, magnesium, titanium and tantalum may be used instead of aluminum. Generally, the anodized layer has insulating properties, and alumina has superior electrical insulating properties.

A metal layer pattern 330 is formed on the anodized layer 320. At least one of the semiconductor chips 430, 440, 450 and/or 460 and a lead 470 are mounted on the metal layer pattern 330 through the medium of the solder paste layer (not shown).

The semiconductor chips 430, 440, 450 and/or 460 may include a power control semiconductor chip and/or a low-power semiconductor chip driving the power control semiconductor chip. For example, the semiconductor chips 430, 440, 450 and/or 460 may include a silicon-controlled rectifier (SCR), a power transistor, an insulated-gate bipolar transistor (IGBT), a metal oxide semiconductor (MOS) transistor, a power rectifier, a power regulator, an inverter, a converter, or a combination thereof. The semiconductor chips 430, 440, 450 and/or 460 are electrically connected to the metal layer pattern 330 by a bonding wire (not shown). Meanwhile, the anodized layer 320 insulates the semiconductor chips 430, 440, 450 and/or 460 and the heat sink 310.

Although a dual in-line package (DIP) having two rows of leads 470 is exemplarily illustrated in FIG. 4, the scope of the present invention is not limited to the structure of the lead 470. For example, a single in-line package (SIP) having a single row of the lead 470 may be applied.

The depth H of the cavity C of the heat sink 310 may be greater than the sum of a height of the anodized layer 320, a height of the metal layer pattern 330, a height of the semiconductor chips 430, 440, 450 and/or 460. Here, the anodized layer 320, the metal layer pattern 330 and the semiconductor chips 430, 440, 450 and/or 460 are arranged in the cavity C and do not protrude the upper surface of the heat sink 310.

Empty space of the cavity C may be filled with an epoxy resin 550 in order to protect the anodized layer 320, the metal layer pattern 330 and the semiconductor chips 430, 440, 450 and/or 460. The lead 470 may extend from the metal layer pattern 330 outside of the epoxy resin 550. Thus, only a part of the lead 470 can be sealed with the epoxy resin 550.

Figure 5A:
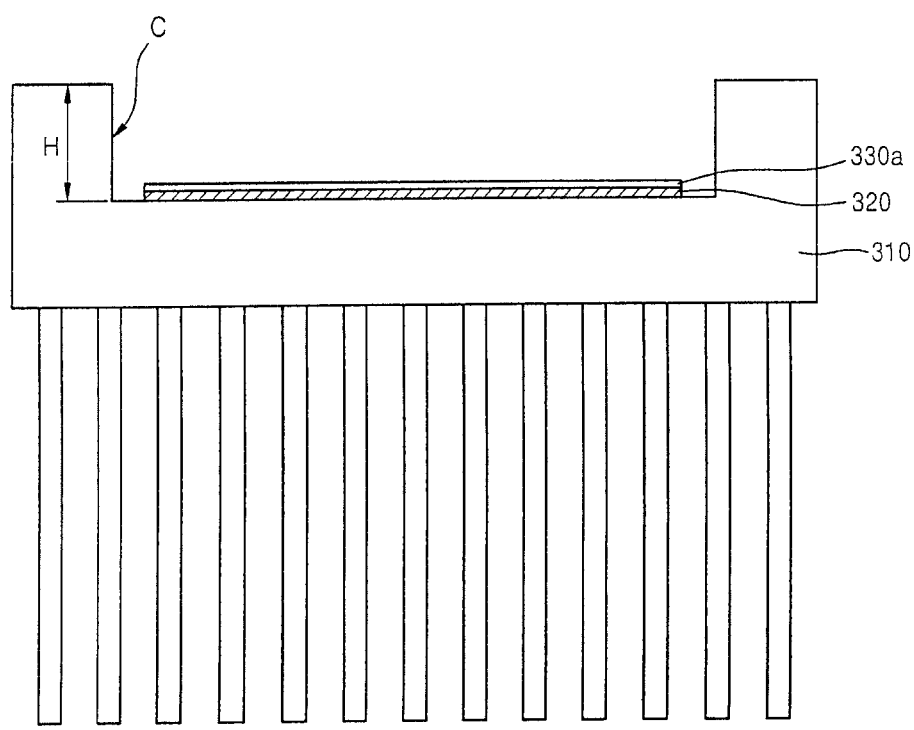
FIGS. 5A, 5C to 5E are cross-sectional views of the heat sink package of FIG. 4.
Figure 5B:
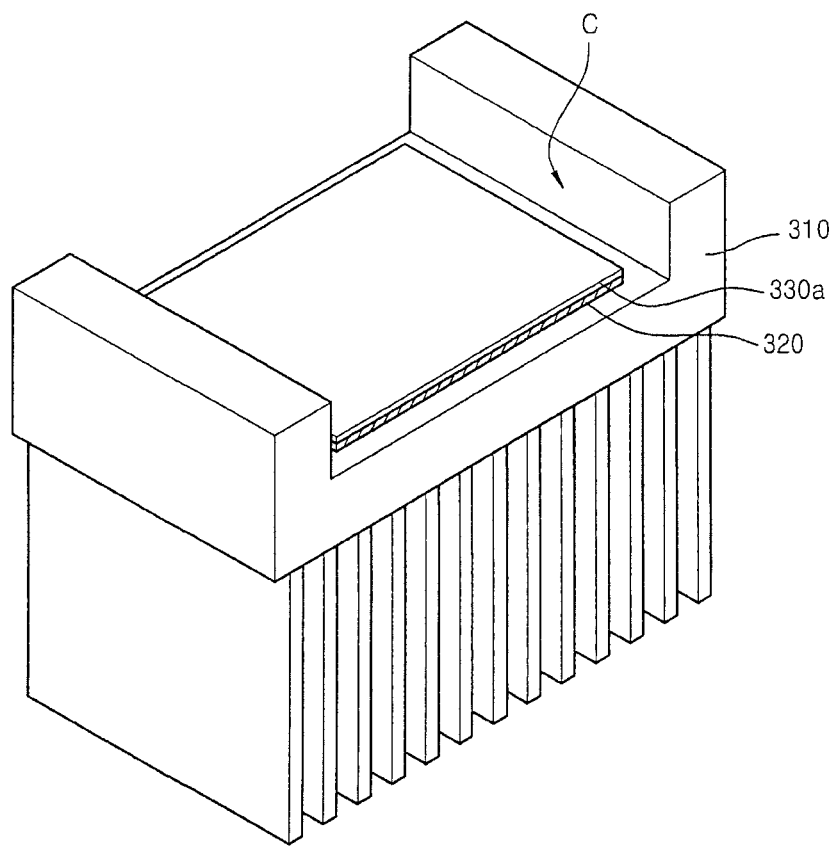
FIG. 5B is a perspective view of the heat sink package of FIG. 4.

FIGS. 5A, 5C to 5E are cross-sectional view of the heat sink package of FIG. 4, and FIG. 5B is a perspective view of the heat sink package of FIG. 4 illustrating a method fabricating the heat sink package.

Referring to FIG. 5A, a heat sink 310 having a cavity C on an upper surface thereof is prepared. An insulating anodized layer 320 is formed on the bottom surface of the cavity C. The anodized layer 320 may be formed on the entire or a part of bottom surface of the cavity C. The heat sink 310 may include aluminum. In this case, the anodized layer 320 may include alumina (Al$_2$O$_3$). However, these materials forming the heat sink 310 and the anodized layer 320 are exemplarily described, and the scope of the present invention is not limited thereto. The metal layer 330a is formed on the anodized layer 320.

Referring to the cross-sectional view of the heat sink shown in FIG. 5A and the perspective view of the heat sink shown in FIG. 5B, the cavity C has a concave shape on the upper surface of the heat sink 310. However, the cavity is exemplarily illustrated. The cavity C may have any configuration as long as the anodized layer 320, the metal layer pattern 330 and the semiconductor chips 430, 440, 450 and/or 460 can be arranged in the cavity C and do not protrude the upper surface of the heat sink 310. For example, according to FIG. 5B, the cavity C in a length direction of the heat sink 310 are closed by side walls and the cavity in a width direction of the heat sink 310 are open. However, all of the side walls of the cavity C may be closed according to another embodiment.

The depth H of the cavity C of the heat sink 310 may be greater than the sum of a height of the anodized layer 320, a height of the metal layer pattern 330, and a height of the semiconductor chips 430, 440, 450 and/or 460.

Figure 5C:
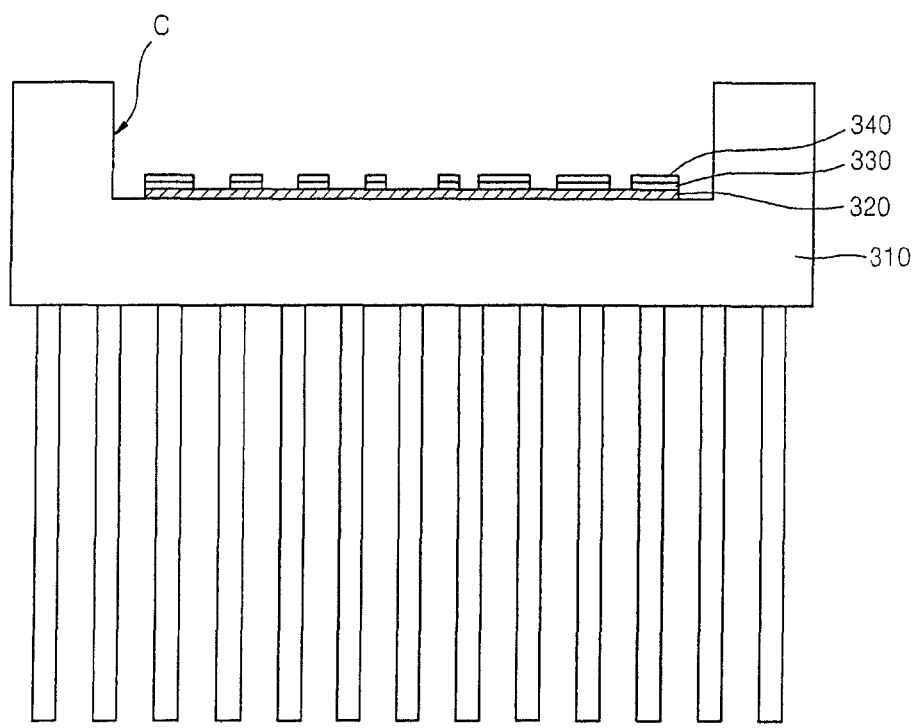

Referring to FIG. 5C, the metal layer 330a is patterned to form a metal layer pattern 330, and then a solder paste layer 340 is formed on the metal layer pattern 330. The solder paste layer 340 may be formed on the metal layer pattern 330 using dotting or screen printing.

Figure 5D:
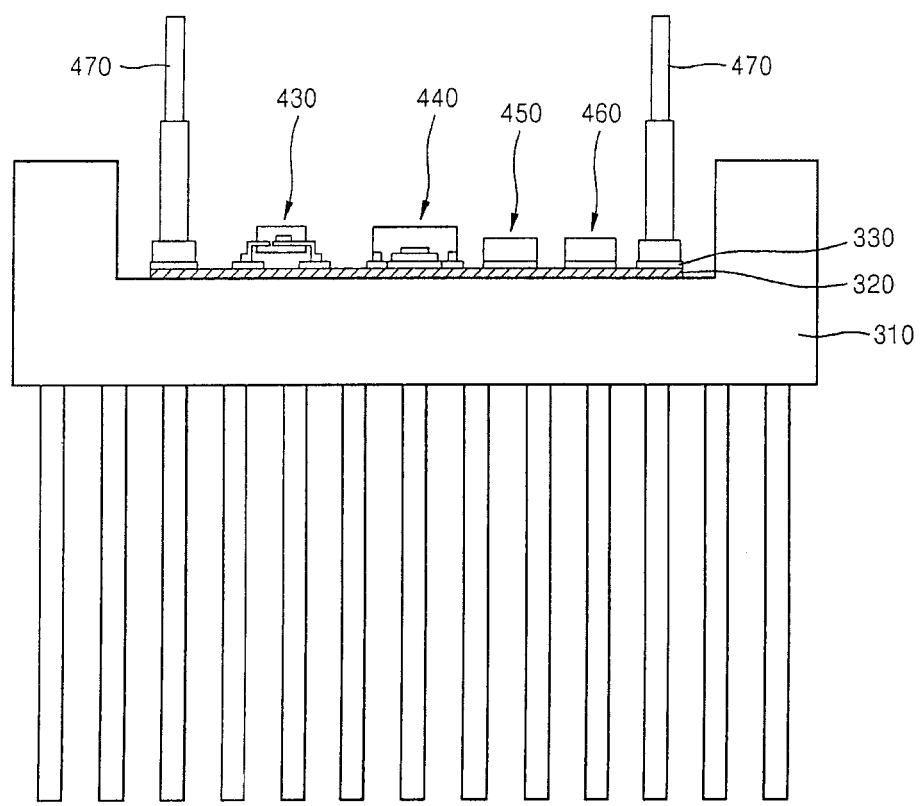

Referring to FIG. 5D, at least one semiconductor chips 430, 440, 450 and/or 460 and a lead 470 are mounted on the metal layer pattern 330. Although not shown in FIG. 5D, a solder paste layer may be interposed between the metal layer pattern 330 and the semiconductor chips 430, 440, 450 and/or 460.

Figure 5E:
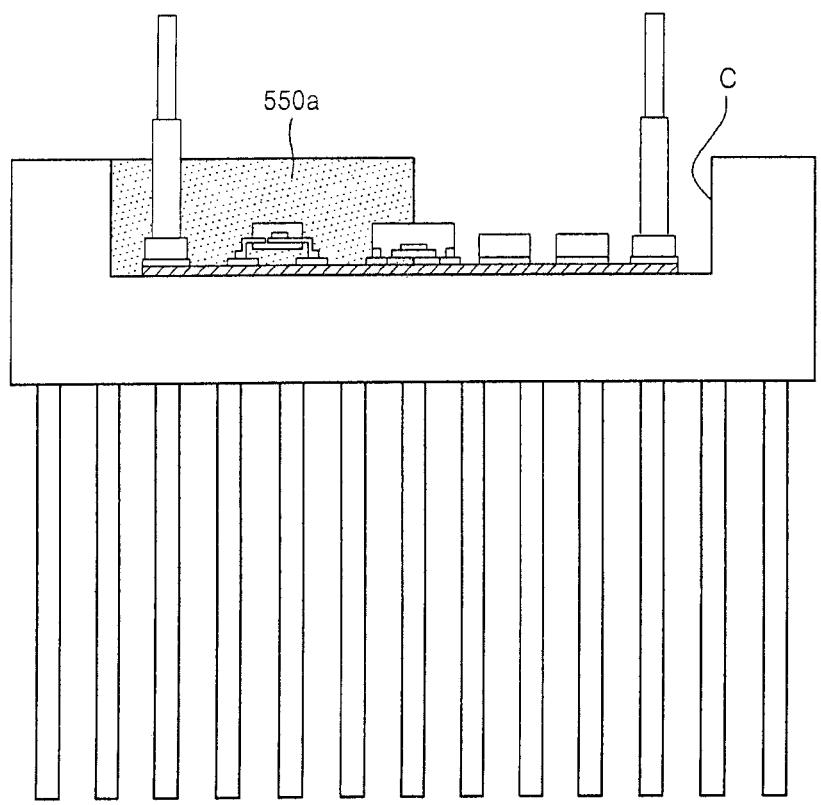

Referring to FIG. 5E, empty space of the cavity C may be filled with an epoxy resin 550a in order to protect the anodized layer 320, the metal layer pattern 330 and the semiconductor chips 430, 440, 450 and/or 460. FIG. 5E illustrates a process of filling the cavity C with an epoxy resin 550a. The epoxy resin 550a may be filled in the cavity C using a potting method. After the cavity C is filled with the epoxy resin 550, a curing process is performed. Subsequently, electrical tests are performed to determine the performance of products.

Figure 6:
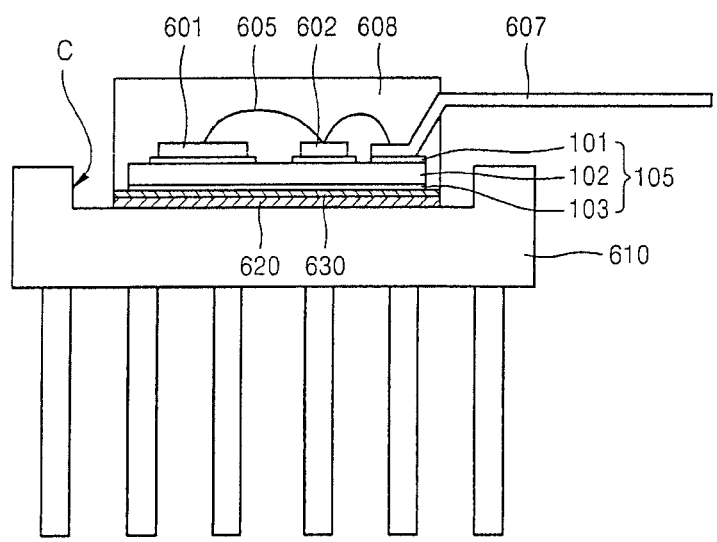
FIG. 6 is a cross-sectional view of a heat sink package according to another embodiment of the present invention.

FIG. 6 is a cross-sectional view of a heat sink package according to another embodiment of the present invention.

Referring to FIG. 6, a heat sink package includes a heat sink 610 having a cavity on an upper surface thereof. A metal layer 620 is formed on the bottom surface of the cavity C. The metal layer 620 may be formed on the entire or a part of bottom surface of the cavity C.

The heat sink 610 may include aluminum. In this case, the metal layer 620 may include copper. However, these materials forming the heat sink 610 and the metal layer 620 are exemplarily described, and the scope of the present invention is not limited thereto. The copper layer may be formed, for example, by plating, but may also be formed by a chemical vapor deposition.

A solder paste layer 630 is formed on the metal layer 620. Since the solder paste layer 630 assembles the heat sink 610 and a semiconductor package, a bolt member which is conventionally required is not necessary.

The semiconductor package may include a substrate 105; at least one of semiconductor chips 601 and 602 and a lead 607 mounted on the substrate 105; and a molding member 608 sealing the semiconductor chips 601 and 602 on the substrate 105. The molding member 608 may be formed to expose the lower surface of the substrate 105 so that the substrate 105 can be attached to the solder paste layer 630. The molding member 608 may be an epoxy molding compound (EMC).

The substrate 105 may be a direct bonded copper (DBC) substrate, a thick or thin film copper (TFC) substrate or a direct fired copper (DFC) substrate. FIG. 6 illustrates a DBC substrate and a TFC substrate. The DBC substrate and TFC substrate may include an insulating layer 102 formed of an insulating material, for example, a ceramic material, an upper pattern 101 formed of copper and a lower pattern 103 formed of copper. The insulating layer 102 included in the substrate 105 insulates semiconductor chips 601 and 602 and the heat sink 610.

The semiconductor chips 601 and 602 may include a power control semiconductor chip and/or a low-power semiconductor chip driving the power control semiconductor chip. For example, the semiconductor chips 601 and 602 may include a silicon-controlled rectifier (SCR), a power transistor, an insulated-gate bipolar transistor (IGBT), a metal oxide semiconductor (MOS) transistor, a power rectifier, a power regulator, an inverter, a converter or a combination thereof. The semiconductor chips 601 and 602 are electrically connected to each other or to the substrate 105 and/or lead 607 by a bonding wire 605.

Although a single in-line package (SIP) having a single row of the lead 607 is exemplarily illustrated in FIG. 6, the scope of the present invention is not limited to the structure of the lead 607. For example, a dual in-line package (DIP) having two rows of leads 607 may be applied. The lead 607 is attached to the substrate 105 and extends outside of the molding member 608.

A lower portion of the semiconductor package including the substrate 105, the semiconductor chips 601 and 602 and the molding member 608 is disposed in the cavity C of the heat sink 610, and an upper portion of the semiconductor package may protrude the upper surface of the heat sink 610. However, the configuration of the semiconductor package is exemplarily illustrated herein, and the scope of the present invention is not limited thereto. For example, the semiconductor package may be disposed in the cavity C such that the upper portion of the semiconductor package does not protrude the upper surface of the heat sink 610. Empty space which is not occupied by the semiconductor package in the cavity C may be filled with an epoxy resin.

Figure 7A:
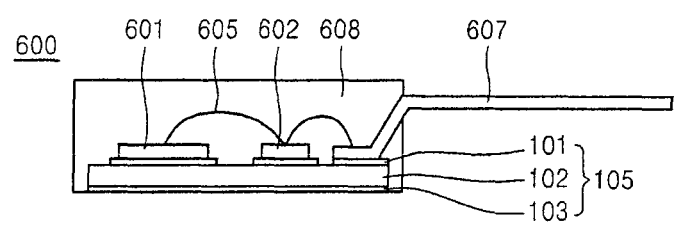
FIGS. 7A to 7C are cross-sectional views of the heat sink package of FIG. 6 illustrating a method fabricating the heat sink package.
Figure 7B:
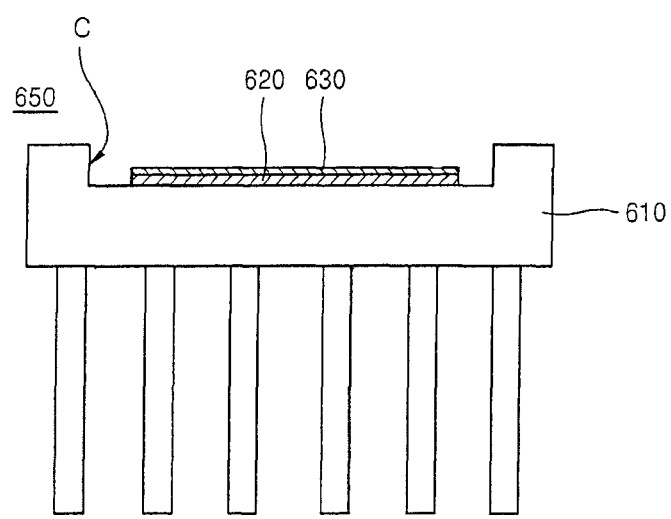
Figure 7C:
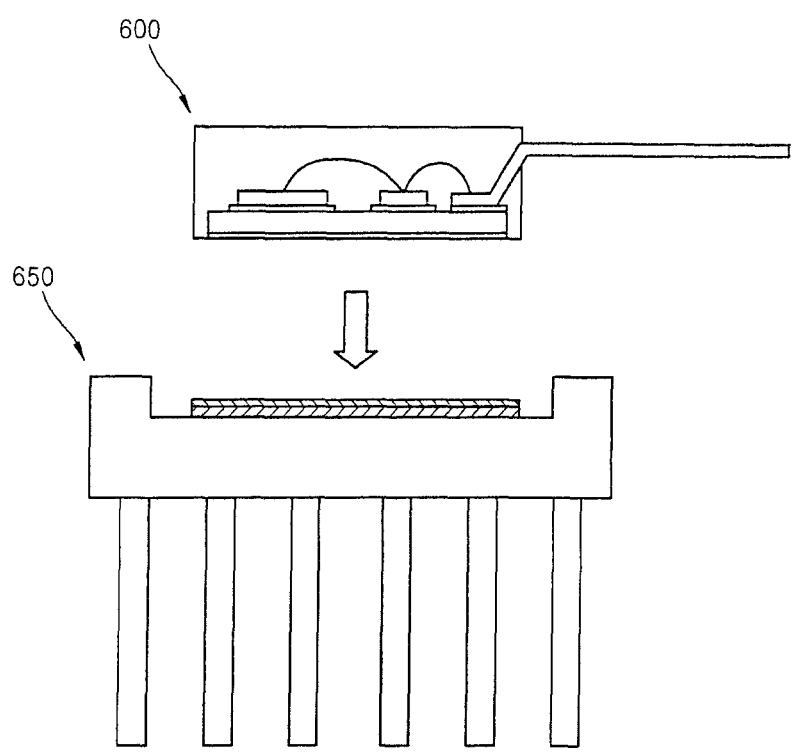

FIGS. 7A to 7C are cross-sectional views of the heat sink package of FIG. 6 illustrating a method fabricating the heat sink package.

Referring to FIG. 7A, a semiconductor package 600 includes a substrate 105; at least one semiconductor chips 601 and 602 and a lead 607 formed on the substrate 105; and a molding member 608 sealing the semiconductor chips 601 and 602 on the substrate 105.

The substrate 105 may be a direct bonded copper (DBC) substrate, a thick or thin film copper (TFC) substrate or a direct fired copper (DFC) substrate. FIG. 7A illustrates a DBC substrate or TFC substrate. The DBC substrate and TFC substrate may include an insulating layer 102 formed of an insulating material, for example, a ceramic material, an upper pattern 101 formed of copper and a lower pattern 103 formed of copper. The semiconductor chips 601 and 602 and the lead 607 may be mounted on the upper pattern 101 of the substrate 105. The lead 607 extends outside of the molding member 608.

Referring to FIG. 7B, a heat sink 610 having a cavity C on an upper surface thereof is prepared. A metal layer 620 is formed on the bottom surface of the cavity C. The metal layer 620 may be formed on the entire or a part of bottom surface of the cavity C. The heat sink 610 may include aluminum. In this case, the metal layer 620 may include copper. However, these materials forming the heat sink 610 and the metal layer 620 are exemplarily described, and the scope of the present invention is not limited thereto. The copper layer may be formed, for example, by plating, but may also be formed by a chemical vapor deposition.

After the metal layer 620 is formed, a solder paste layer 630 is formed on the metal layer 620 to form a heat sink structure 650. The solder paste layer 630 may be formed on the metal layer 620 using a dotting or screen printing method.

Referring to FIG. 7C, the semiconductor package 600 is mounted on the heat sink structure 650 to prepare the heat sink package. That is, since the substrate of the semiconductor package 600 is attached to the solder paste layer of the heat sink structure 650, a bolt member which is conventionally required is not necessary. Subsequently, electrical tests are performed to determine the performance of products.

Figure 8:
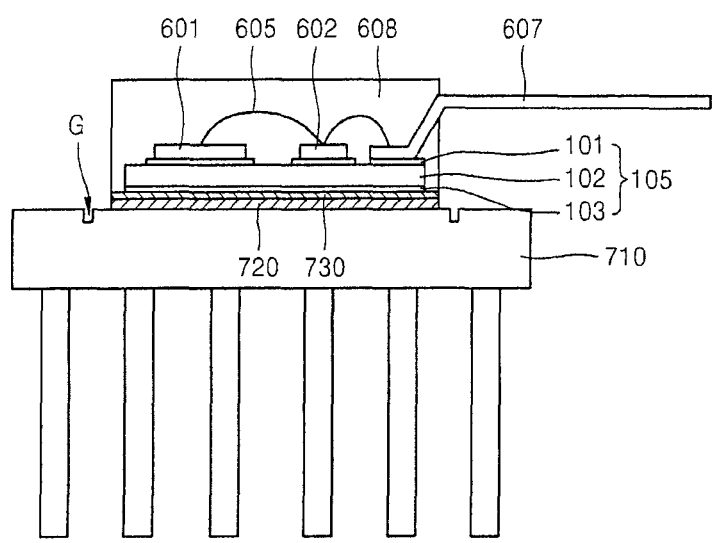
FIG. 8 is a cross-sectional view of a heat sink package according to another embodiment of the present invention.

FIG. 8 is a cross-sectional view of a heat sink package according to another embodiment of the present invention.

Referring to FIG. 8, a heat sink package includes a heat sink 710 not having a cavity on an upper surface thereof. A metal layer 720 is formed on an upper surface of the heat sink 710.

The heat sink 710 may include aluminum. In this case, the metal layer 720 may include copper. However, these materials forming the heat sink 710 and the metal layer 720 are exemplarily described, and the scope of the present invention is not limited thereto. The copper layer may be formed, for example, by plating, but may also be formed by a chemical vapor deposition.

A solder paste layer 730 is formed on the metal layer 720. Since the solder paste layer 730 assembles the heat sink 710 and a semiconductor package, a bolt member which is conventionally required is not necessary.

The semiconductor package may include a substrate 105; at least one of semiconductor chips 601 and 602 and a lead 607 mounted on the substrate 105; and a molding member 608 sealing the semiconductor chips 601 and 602 on the substrate 105. The semiconductor package illustrated in FIG. 8 is the same as that of FIG. 6.

Figure 9A:
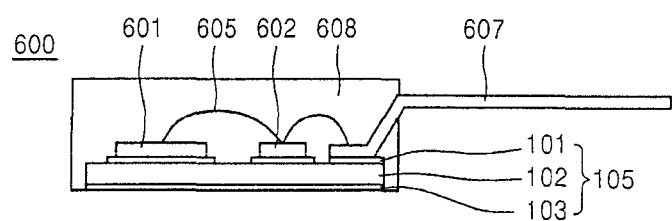
FIGS. 9A, 9B and 9D are cross-sectional views of the heat sink package of FIG. 8.
Figure 9B:
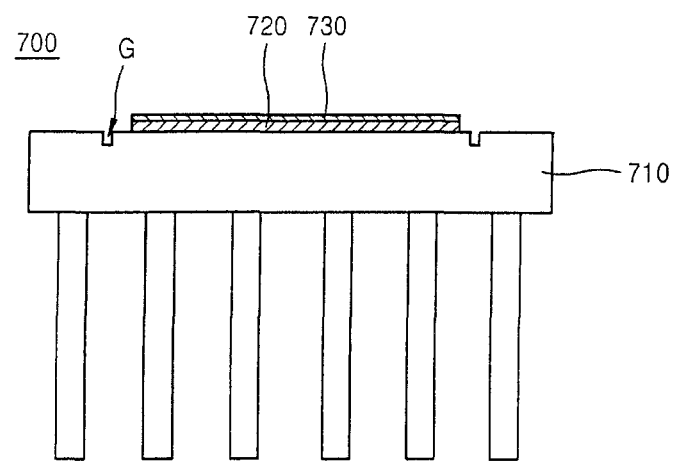
Figure 9C:
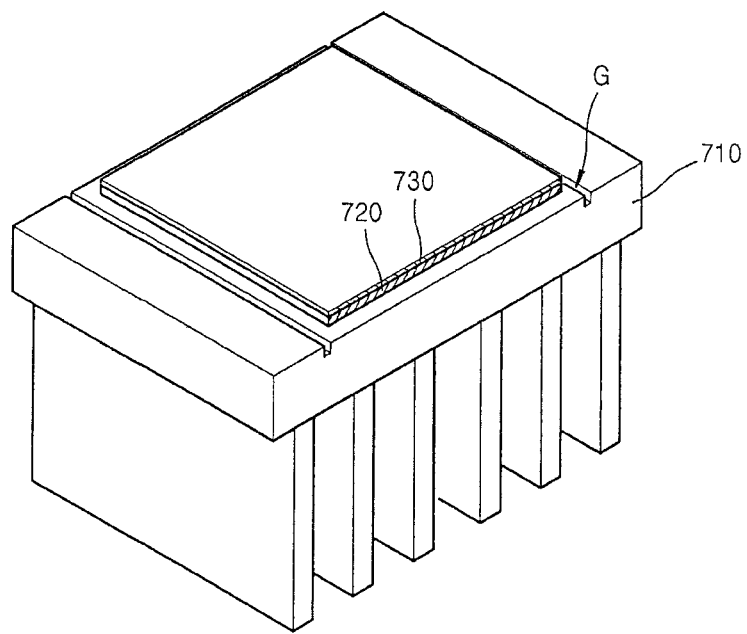
FIG. 9C is a perspective view of the heat sink package of FIG. 8 illustrating a method fabricating the heat sink package.
Figure 9D:
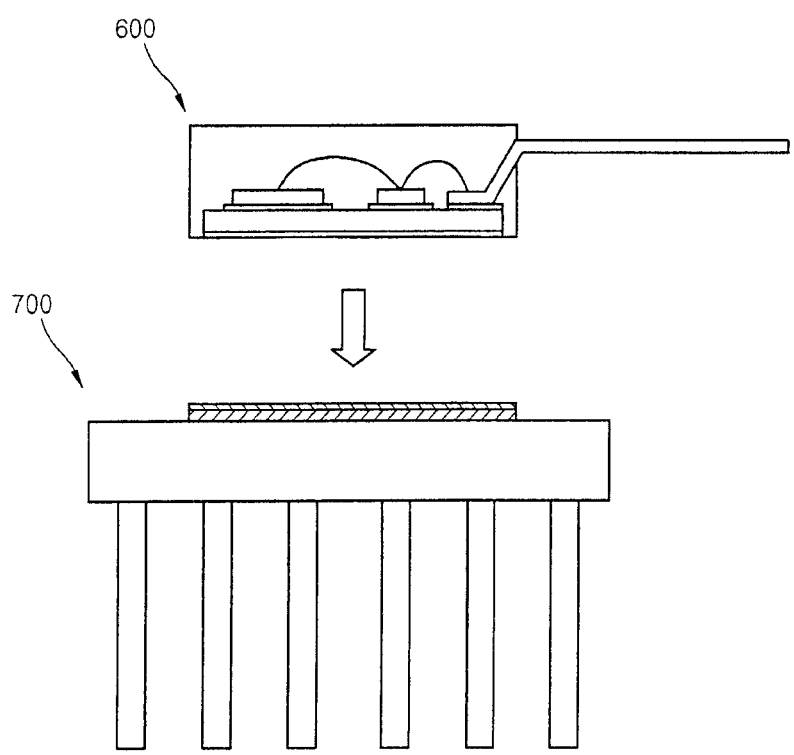

FIGS. 9A, 9B and 9D are cross-sectional views of the heat sink package of FIG. 8, and FIG. 9C is a perspective view of the heat sink package of FIG. 8 illustrating a method fabricating the heat sink package.

Referring to FIG. 9A, the semiconductor package 600 includes a substrate 105; at least one of semiconductor chips 601 and 602 and a lead 607 mounted on the substrate 105; and a molding member 608 sealing the semiconductor chips 601 and 602 on the substrate 105. The semiconductor package 600 is described with reference to FIG. 7A, and will not be present herein.

Referring to FIGS. 9B and 9C, a heat sink 710 not having a cavity on an upper surface thereof is prepared. A metal layer 720 is formed on an upper surface of the heat sink 710. The heat sink 710 may include aluminum. In this case, the metal layer 720 may include copper. However, these materials forming the heat sink 710 and the metal layer 720 are exemplarily described, and the scope of the present invention is not limited thereto. The copper layer may be formed, for example, by plating, but may also be formed by a chemical vapor deposition.

The solder paste layer 730 is formed on the metal layer 720 to form a heat sink structure 700. The solder paste layer 730 may be formed on the metal layer 720 using a dotting or screen printing method. Since the solder paste layer 730 assembles the heat sink 710 and the substrate 105, a bolt member which is conventionally required is not necessary.

Referring to the cross-sectional view of the heat sink shown in FIG. 9B and the perspective view of the heat sink shown in FIG. 9C, a groove is formed on the upper surface of the heat sink 710. The groove G is formed in order to prevent overflow of the solder paste layer 730 when the solder paste layer 730 is formed.

Referring to FIG. 9C, the groove G is disposed in parallel to the width direction of the heat sink 710. However, the groove G is exemplarily illustrated. The groove G may be formed in any way as long as it can prevent overflow of the solder paste layer 730 in subsequent processes. For example, a groove G may further be disposed in parallel to the length direction of the heat sink 710 around the solder paste layer 730.

Referring to FIG. 9D, the semiconductor package 600 is mounted on the heat sink structure 700 to prepare the heat sink package. That is, since the substrate of the semiconductor package 600 is attached to the solder paste layer of the heat sink structure 700, a bolt member which is conventionally required is not necessary. Subsequently, electrical tests are performed to determine the performance of products.

In the heat sink package according to the present invention, the semiconductor package and the heat sink can be bound to each other in order to prevent cracks and warpages and secure low thermal resistance.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A heat sink package comprising:
    a heat sink having a cavity on an upper surface thereof;
    an insulating anodized layer formed on the bottom surface of the cavity;
    a metal layer pattern contacting the anodized layer; and
    a lead and a semiconductor chip, each mounted on the metal layer pattern.

2. The heat sink package of claim 1, wherein the heat sink comprises aluminum and the anodized layer comprises Al2O3.

3. The heat sink package of claim 1, wherein the anodized layer, the metal layer pattern and the semiconductor chip are arranged in the cavity.

4. The heat sink package of claim 1, wherein the cavity has a depth greater than the sum of a height of the anodized layer, a height of the metal layer pattern, and a height of the semiconductor chip.

5. The heat sink package of claim 1, further comprising an epoxy resin filling in the cavity in order to protect the anodized layer, the metal layer pattern and the semiconductor chip.

6. The heat sink package of claim 5, wherein the lead extends from the metal layer pattern toward the outside of the epoxy resin.

7. A heat sink package comprising:
    a heat sink having a cavity on an upper surface thereof;
    an insulating anodized layer formed on the bottom surface of the cavity;
    a metal layer pattern contacting the anodized layer;
    a lead and a semiconductor chip, each mounted on the metal layer pattern;
    wherein the anodized layer, the metal layer pattern and the semiconductor chip are arranged in the cavity having a depth greater than the sum of a height of the anodized layer, a height of the metal layer pattern, and a height of the semiconductor chip.

8. The heat sink package of claim 7, further comprising an epoxy resin filling in the cavity in order to protect the anodized layer, the metal layer pattern and the semiconductor chip.

9. The heat sink package of claim 8, wherein the lead extends from the metal layer pattern toward the outside of the epoxy resin.

10. A heat sink package comprising:
    a heat sink having a cavity on an upper surface thereof;
    an insulating anodized layer formed on the bottom surface of the cavity;
    a metal layer pattern on the anodized layer;
    two or more semiconductor chips, each chip having a plurality of terminal, said terminals electrically connected the metal layer pattern, and
    one or more leads mounted on the metal layer pattern and extending from the metal layer pattern and beyond cavity.

11. The heat sink package of claim 10, wherein the heat sink comprises aluminum and the anodized layer comprises Al2O3.

12. The heat sink package of claim 10, wherein the anodized layer, the metal layer pattern and the semiconductor chips are arranged in the cavity.

13. The heat sink package of claim 10, wherein the cavity has a depth greater than the sum of a height of the anodized layer, a height of the metal layer pattern, and a height of the tallest semiconductor chip.

14. The heat sink package of claim 10, further comprising an epoxy resin filling in the cavity in order to protect the anodized layer, the metal layer pattern and the semiconductor chips.

15. The heat sink package of claim 14, wherein the lead extends from the metal layer pattern toward the outside of the epoxy resin.

16. The heat sink package of claim 10 wherein bond wires electrically connect the terminals of the semiconductor chips to the metal layer pattern.

* * * * *